United States Patent [19]

Ikeda et al.

[11] Patent Number: 5,428,250

[45] Date of Patent: Jun. 27, 1995

[54] LINE MATERIAL, ELECTRONIC DEVICE USING THE LINE MATERIAL AND LIQUID CRYSTAL DISPLAY

[75] Inventors: Mitsushi Ikeda, Kanagawa; Michio Murooka, Tokyo, both of Japan

[73] Assignee: Kabushiki Kaisha Toshiba, Kawasaki, Japan

[21] Appl. No.: 95,702

[22] Filed: Jul. 22, 1993

Related U.S. Application Data

[63] Continuation of Ser. No. 620,209, Nov. 30, 1990, Pat. No. 5,264,728.

[30] Foreign Application Priority Data

Nov. 30, 1989 [JP] Japan ................. 1-313674
Feb. 26, 1990 [JP] Japan ................. 2-047028

[51] Int. Cl.$^6$ ........................................ H01L 23/48
[52] U.S. Cl. ............................... 257/761; 257/59; 257/762; 257/766; 359/87
[58] Field of Search ............. 257/761, 59, 60, 412, 257/764, 768, 762, 765, 766; 359/87, 88

[56] References Cited

U.S. PATENT DOCUMENTS

| | | |
|---|---|---|
| 3,701,931 | 10/1972 | Revitz et al. |
| 3,869,367 | 3/1975 | Sato et al. |
| 3,877,063 | 4/1975 | Abraham et al. |
| 4,251,326 | 2/1981 | Arcidiacono et al. ........... 205/125 |
| 4,523,811 | 6/1985 | Ota. |
| 4,534,623 | 8/1985 | Araki. |
| 4,707,723 | 11/1987 | Okamoto et al. |
| 4,730,903 | 3/1988 | Yamazaki et al. ........... 359/58 |
| 4,829,363 | 5/1989 | Thomas et al. ........... 257/761 |
| 4,903,117 | 2/1990 | Okamoto et al. |
| 4,905,066 | 2/1990 | Dohjo et al. |
| 4,910,578 | 3/1990 | Okamoto. |
| 4,933,743 | 6/1990 | Thomas et al. |
| 4,975,760 | 12/1990 | Dohjo et al. |
| 4,985,750 | 1/1991 | Hoshino ........... 257/761 |
| 5,164,850 | 11/1992 | Tanaka et al. ........... 359/58 |
| 5,170,244 | 12/1992 | Dohjo et al. ........... 257/761 |
| 5,264,728 | 11/1993 | Ikeda et al. ........... 257/761 |

FOREIGN PATENT DOCUMENTS

| | | |
|---|---|---|
| 0236629 | 9/1987 | European Pat. Off. |
| 3229203 | 8/1982 | Germany. |
| 63-65669 | 3/1988 | Japan. |
| 2-73330 | 3/1990 | Japan. |
| 2169746 | 11/1985 | United Kingdom. |
| 2213987 | 12/1987 | United Kingdom. |

OTHER PUBLICATIONS

"Physics of Thin Films, Advances in Research and Development", vol. 2, N. Schwartz, p. 363, 1964.
Feinstein et al., Thin Solid Films, vol. 12, p. 547, 1972.
Feinstein et al., Thin Solid Films, vol. 16, p. 129, 1973.
Wittmar, "High-temperature contact structures for silicon semiconductor devices," Applied Physics Letters, 37(6), Sep. 1980, pp. 540-541.
Face et al., Journal of Vacuum Science & Technology, vol. A1, p. 326, Jun. 1983.
Ikeda et al., Journal of Applied Physics, vol. 66, p. 2052, Sep. 1989.
Nomoto et al., Japan Display 1989 Digest, p. 503, 1989.
Ono et al., Society for Information Display Digest 1990, p. 518, 1990.

*Primary Examiner*—Jerome Jackson
*Assistant Examiner*—Courtney A. Bowers
*Attorney, Agent, or Firm*—Oblon, Spivak, McClelland, Maier, & Neustadt

[57] ABSTRACT

The line material is of a laminated structure consisting of: a Ta containing N alloy layer (lower layer) which is a first metal layer made of at least an alloy selected from the group consisting of a TaN alloy, a Ta—Mo—N alloy, a Ta—Nb—N alloy and a Ta—W—N alloy; a second metal layer (upper layer) formed integrally with the first metal layer and made of at least an alloy selected from the group consisting of Ta, a Ta—Mo alloy, a Ta—Nb alloy, a Ta—W alloy, a TaN alloy, a Ta—Mo—N alloy, a Ta—Nb—N alloy and a Ta—W—N alloy; and/or a pin hole-free oxide film. The line material of the laminated structure is to be applied to the formation of signal lines and electrodes of, e.g., a liquid crystal display. The line material has a low resistance and the insulating film formed by anodization and the like exhibits excellent insulation and thermal stability. Therefore, when the line material is applied to signal lines of various devices, it exhibits excellent characteristics.

7 Claims, 13 Drawing Sheets

LINE MATERIAL, ELECTRONIC DEVICE USING THE LINE MATERIAL AND LIQUID CRYSTAL DISPLAY

This is a continuation of application Ser. No. 07/620,289, filed Nov. 30, 1990, U.S. Pat. No. 5,264,728.

BACKGROUND OF THE INVENTION

1. Field of the Invention

This invention relates to both a line material adapted for forming electronic circuits and an electronic device such as an active matrix type liquid crystal display using such line material.

2. Description of the Related Art

Active matrix type liquid crystal display elements are gaining attention, which display element uses thin film transistors (TFT) made of an amorphous silicon (a-Si) film as its switching elements. This is because the feature that the a-Si film can be formed at low temperatures on an inexpensive glass substrate may open the way to producing a large area, high density and high definition panel display (flat-type television) inexpensively. This type of active matrix type liquid crystal display element is made up of some hundreds to thousands of address and data lines with each of their intersecting points provided with a TFT, a pixel, and a storage capacitor. The number of the TFTs or the storage capacitors is so large (some ten thousands to some millions) that the performance of this type of display element is governed by their yield.

While each point of intersection between the address and data lines and their inter-line portion at each TFT section are insulated by an insulating film, the presence of pin holes in this insulating film causes two line defects on the address and data lines running through this section. Similarly, any pin holes present in the insulating film between each storage capacitor line and each pixel electrode produce point defects. The insulating films are formed by a plasma CVD (chemical vapor deposition) method, which can form films at low temperatures. However, this plasma CVD method could not eliminate the pin holes caused by contaminants adhering to the chamber walls.

A solution to preventing the generation of such defects is an anodized film. Anodized films have pin holes removed by itself with the application of an electric field thereto during their formation process, and thus the pin holes are eliminated. Anodizable metals include Ta and Mo—Ta alloys. Oxide films of Ta are not satisfactory in resistivity, while oxide films of Mo—Ta alloys are poor in thermal resistance, both missing high thermal resistance and high resistivity requirements for the material of the address and data lines.

Although small-size display elements require only high insulation resistance for their oxide films, the active matrix type liquid crystal display element having a large display area with smallest possible pixels must have thin and long signal lines to each TFT, i.e., the gate line and the data line, and this naturally increases their line resistance. On the other hand, the line resistance must be minimized to eliminate the waveform distortion and delay of pulse signals, thereby requiring low resistivity of line forming metals. In addition, the reverse-staggered TFT structure that a gate electrode line and an a-Si film are sequentially formed and deposited on a glass substrate requires not only a thin gate electrode line but also the gate electrode line being resistant to chemical treatments to which it must undergo in succeeding processes.

The data electrode line materials satisfying these requirements include Ta and Ti. However, their resistivity is still too high to achieve a larger display area and a higher density. It is why the development of a low resistance, highly formable, and chemical treatment resistant material is called for. The staggered TFT structure that the source and drain electrode lines are arranged on the substrate side likewise requires a high resistance, highly formable and chemically resistant material. This problem must be overcome also for non-TFT based active matrix type display elements.

Figure 1:
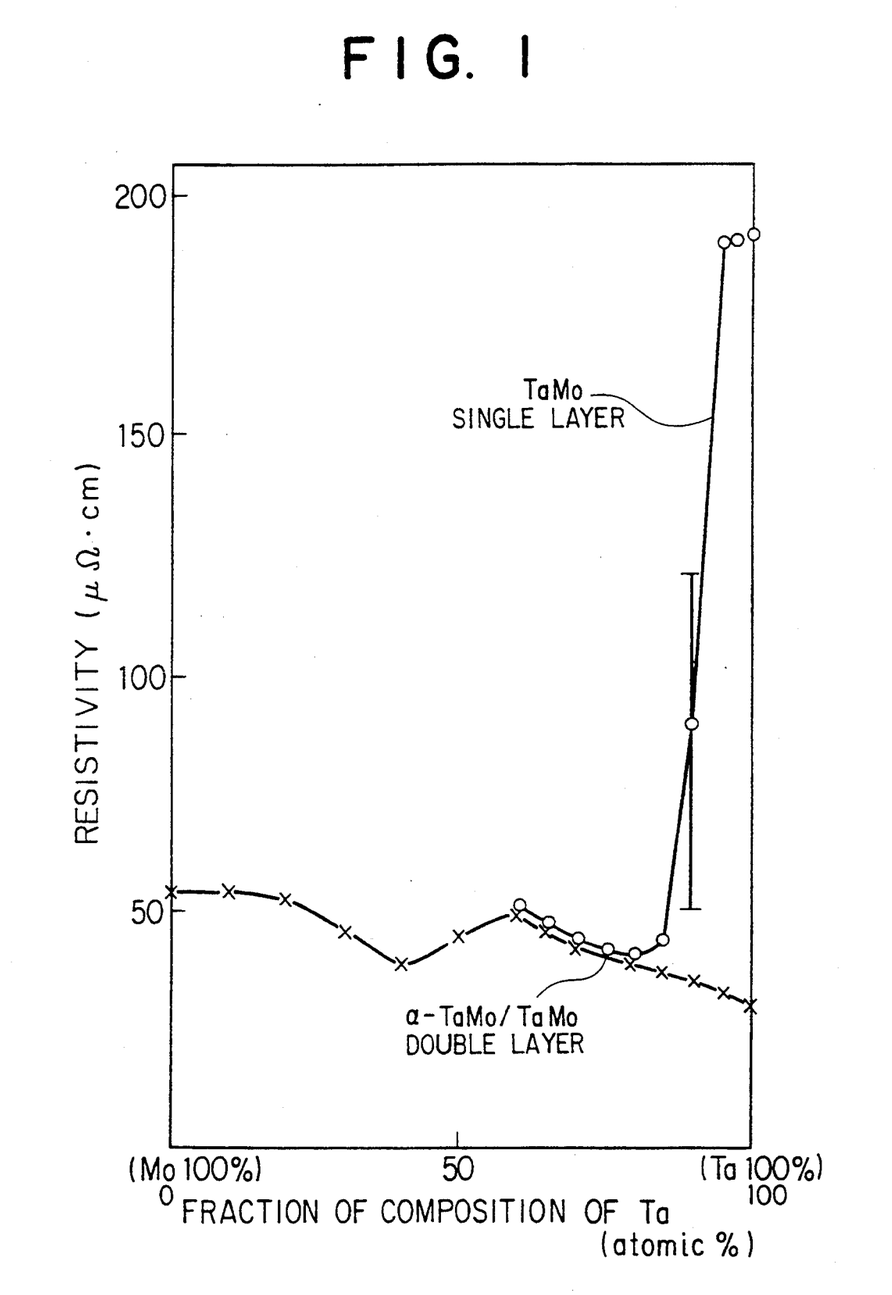
FIG. 1 is a diagram showing the relationship between the compositions of conventional $\alpha$-TaMo/TaMo and TaMo alloys and their resistivity.

Solutions to the above problem are disclosed in Japanese Patent Examined Publications Nos. 48910/86 and 65669/1988: the Mo—Ta alloy and the Ta film on a cubic metal such as shown in FIG. 1, respectively. While these films are proposed as a patterned film satisfying the requirements of low resistance and anodization, the anodized films of Mo—Ta alloys and cubic metals (excluding Ta) are not satisfactory in thermal resistance. The anodized films formed of the above described metals exhibit satisfactory insulation immediately after their formation but such insulation gets deteriorated upon being subjected to thermal treatments of 200° C. or more. The reason is assumed to be that the anodic oxides of cubic metals and Mo—Ta alloys forming the lower layer of the laminated film deteriorate after the thermal treatment in the anodization process.

An object of the invention is to provide a line material which can easily be formed into a low resistance.

Another object of the invention is to provide a line material which can easily be formed into a low resistance and high quality insulating film by an anodization process.

Still another object of the invention is to provide an electronic device having a line made of a low resistance and high quality insulating film which has easily been formed by an oxidation process.

Still another object of the invention is to provide a liquid crystal display which can be easily constructed and whose performance is highly reliable.

SUMMARY OF THE INVENTION

The line material of the invention is of a laminated structure consisting of: a Ta containing N alloy layer (lower layer) which is a first metal layer made of at least an alloy selected from the group consisting of a TaN alloy, a Ta—Mo—N alloy, a Ta—Nb—N alloy and a Ta—W—N alloy; a second metal layer (upper layer) formed integrally with the first metal layer and made of at least an alloy selected from the group consisting of Ta, a Ta—Mo alloy, a Ta—Nb alloy, a Ta—W alloy, a TaN alloy, a Ta—Mo—N alloy, a Ta—Nb—N alloy and a Ta—W—N alloy; and/or a oxide film of these alloys. The line material of the laminated structure is to be applied to the formation of signal lines and electrodes of, e.g., a liquid crystal display.

The TaN alloy forming the first metal contains 30 at. % or more of N; the Ta—Mo—N alloy, the Ta—Nb—N alloy and the Ta—W—N alloy.

The TaN alloy forming the second metal contains 20 at. % or less of N; and the Ta—Mo contains less than 26 at % of Mo alloy, the Ta—Nb alloy, the Ta—W alloy, the TaN alloy, the Ta—Mo—N alloy less than 40 at % of W, the Ta—Nb—N alloy less than 40 at % of Nb and the Ta—W—N alloy.

The invention allows a nitride layer of a Ta alloy having a N content larger than the above to be further laminated on the second metal layer.

The line material of the invention is formed by laminating the second metal on the first metal. The first metal layer is made of one metal or two or more metals in the group, and when made of two or more metals, it may take the form of mixture or laminated structure. Similarly, the second metal layer is made of one metal or two or more metals in the group, and when made of two or more metals, it may take the form of mixture or laminated structure.

The invention uses the TaN alloy or the Ta—M—N alloy (M=Mo, Nb, W) as the lower layer material, and this allows a low resistance $\alpha$ structure to be formed easily, unlike a high resistance $\beta$-Ta, when deposited on a glass substrate.

If the second metal layer is made of the N-containing alloy or alloys, the oxide film formed integrally on the surface by an anodization process readily exhibits satisfactory insulation (high resistivity), thereby reducing leak current due to the thermal treatment and improving the thermal resistance. That is, the TaN or Ta—M—N alloy forming the lower layer functions as a low resistance line (low line resistance), while the anodized film or the like made of the second metal forming the upper layer functions as a satisfactory interlayer insulator. Therefore, the use of the line material in which the TaN, Ta—M—N/Ta, Ta—M or TaN, and the Ta—M—N oxide film are laminated as an address line or the like permits easy production of liquid crystal displays whose performance is ensured even after the thermal treatment. Furthermore, if the requirement of line resistance is not critical for such as small size displays, single layer TaN and Ta—M—N (M=Mo, W, Nb) whose surfaces are oxidized are effective to eliminate image defect.

BRIEF DESCRIPTION OF THE DRAWINGS

FIGS. 2 to 4 are diagrams showing the characteristic of a laminated line material of the invention; in which

DETAILED DESCRIPTION OF THE PREFERRED EMBODIMENTS

Embodiments of the invention will now be described.

Embodiment 1

An exemplary line material and an exemplary embodiment thereof will be described.

Figure 2:
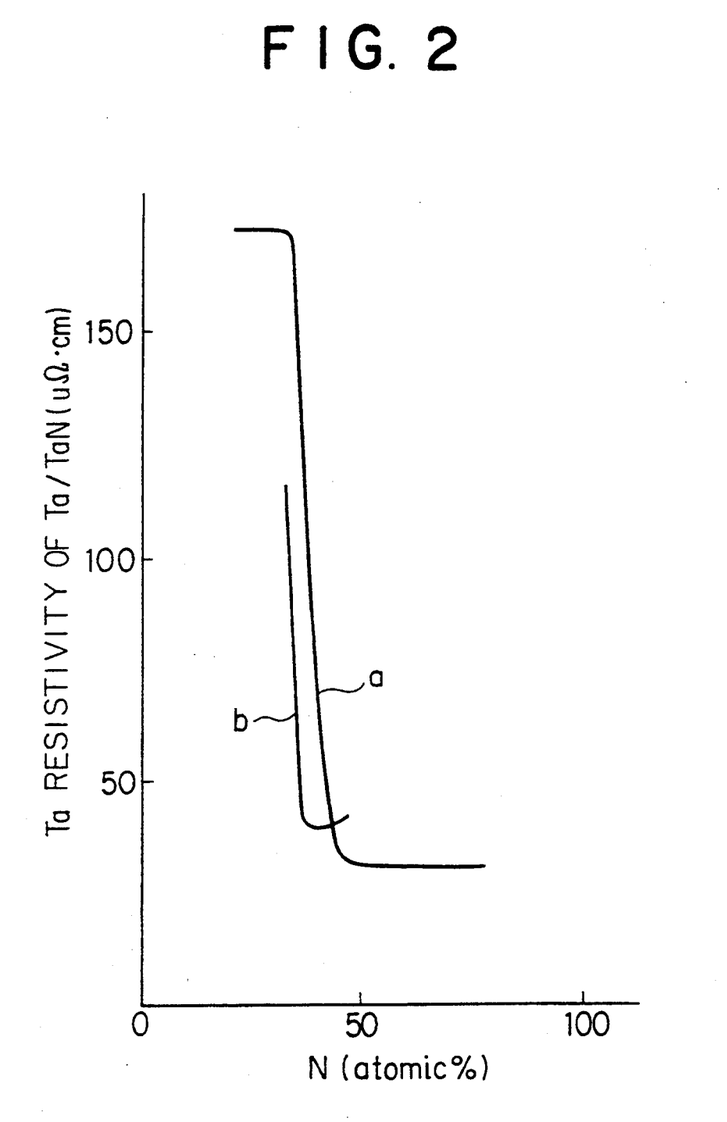
FIG. 2 is a diagram showing the relationship between the composition of a TaN film which is a first metal forming the lower layer and the resistivity of a Ta containing film which is a second metal forming an upper layer.

FIG. 2 shows the resistivity of a Ta layer (film) in function of changing composition of a $TaN_x$ alloy by curve a and curve b in an exemplary laminated line material. The exemplary laminated line material is formed by integrally laminating a Ta layer or an N-doped Ta layer which is the second metal layer forming the upper layer on a $TaN_x$ alloy layer which is the first metal layer forming the lower layer. As is apparent from curve a of FIG. 2, the resistivity of the upper Ta layer starts to decrease as the element N contained in the lower $TaN_x$ layer exceeds about 35 at. %, reaching a level of 35–40 $\mu\Omega$cm at 40 at. %. Also, as shown in curve b, the marginal content of N in the lower $TaN_x$ layer decreases if the element N is doped into the upper Ta layer. The marginal content of N in the lower $TaN_x$ layer for the decreasing resistance is about 20 at. % as the result of doping N into the upper Ta layer.

Figure 3:
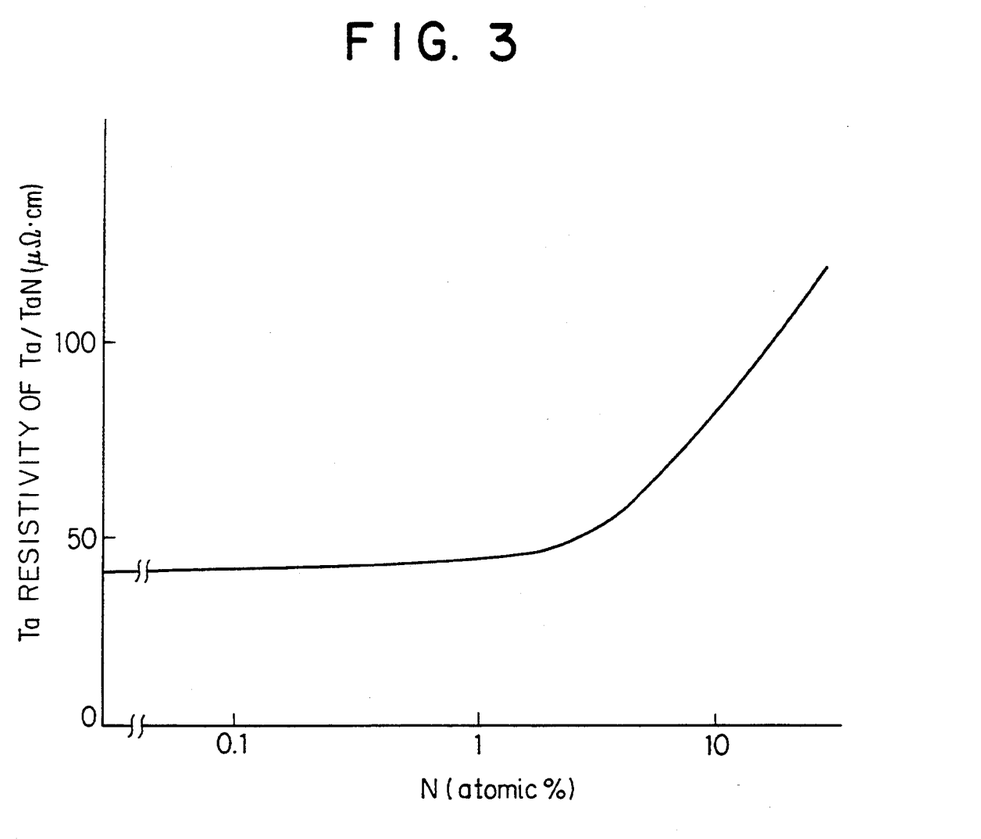
FIG. 3 is a diagram showing the relationship between the amount of doping N in the Ta containing film which is the second metal layer forming the upper layer and its resistivity.

FIG. 3 shows an exemplary relationship between the doping amount of the N-doped upper Ta layer and its resistivity in the above laminated line material. The resistivity of the line material is less than that of $\beta$-Ta structure having a resistance of 180 $\mu\Omega$cm or less if the doping amount is not more than about 20 at. %.

Figure 4:
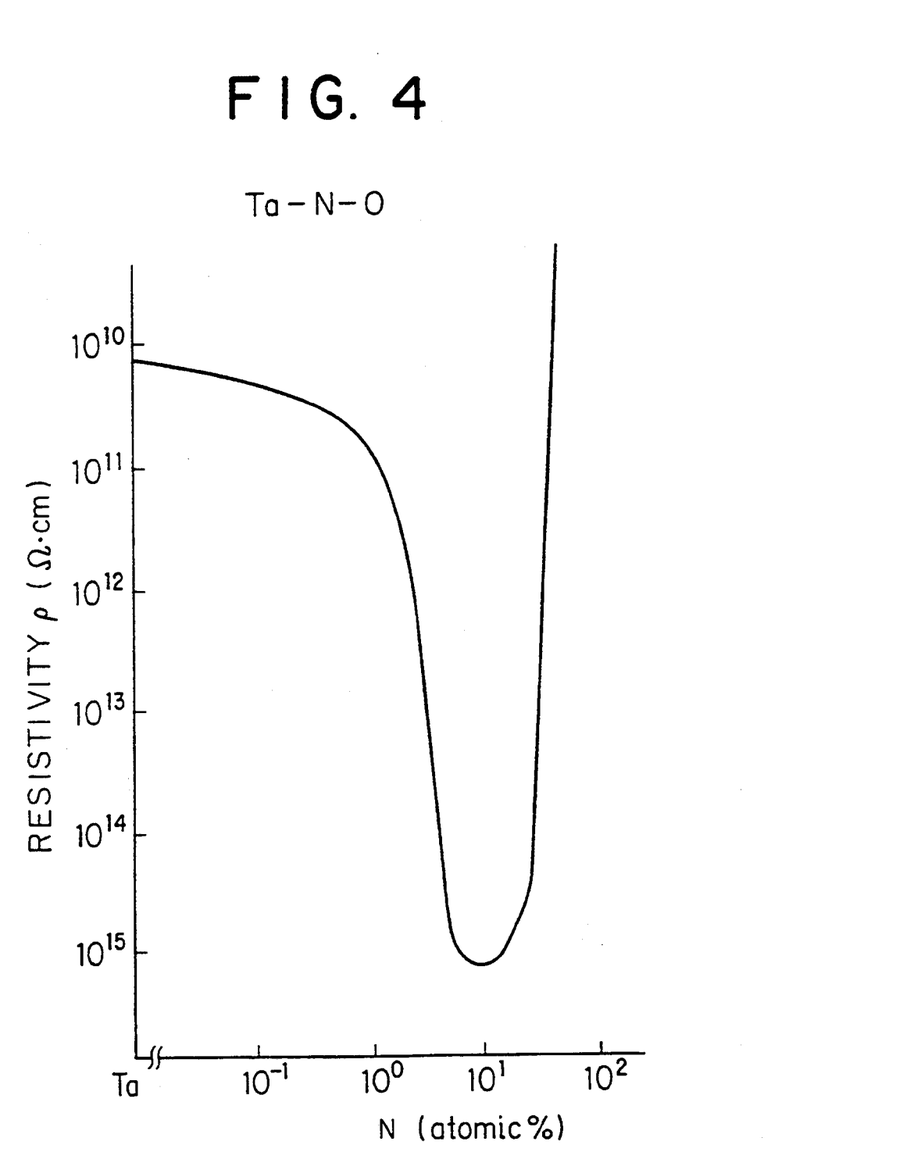
FIG. 4 is a diagram showing the relationship between the amount of doping N in the Ta containing film which is the second metal layer forming the upper layer and the resistivity of the formed anodized film.

FIG. 4 shows an exemplary insulation characteristics in the case where the laminated line material is so constructed that an insulating film (layer) is formed by anodizing the N-doped upper Ta layer. The doping of N increases the resistivity of the film and thus improves its insulation. As is clear from FIG. 4, the insulation of the film is improved with increasing doping amounts. Specifically, the satisfactory film insulation was obtained when N contained in the oxide film formed by the N-doped upper Ta layer was 45 at. % or less.

In the above laminated line material, the fraction of N (value of x) of the $TaN_x$, which is the first metal forming the lower layer and the doping amount in case of doping N into the Ta film, which is the second metal layer forming the upper layer, may not be limited to the above values, because these values are dependent on such requirements as a sputtering system and a sputtering condition for forming the $TaN_x$ and N-doped Ta layers.

An exemplary liquid crystal display using the laminated line material of the invention as its signal lines will now be described.

Figure 5:
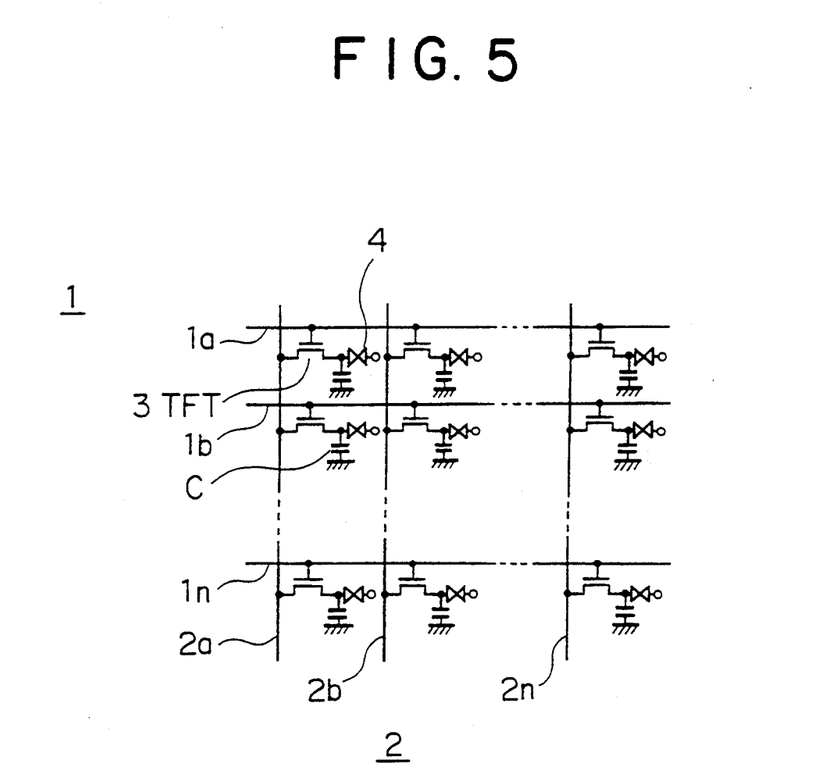
FIG. 5 is an equivalent circuit of an active matrix liquid crystal display.

FIG. 5 is an equivalent circuit of an active matrix liquid crystal display element, which is an embodiment of the invention. Address lines 1 (1a, 1b, ...) and data lines 2 (2a, 2b, ...) are connected in matrix form on the surface of a glass substrate with TFTs 3 arranged at their respective intersecting points. Thus, each TFT 3 has its gate and drain connected to the address line 1 and the data line 2, respectively, while its source to a liquid crystal cell 4 through a pixel electrode. Although a storage capacitor C is additionally provided in FIG. 5, it may be omitted. The gate electrode of the TFT 3 is formed integrally with the address line 1.

Figure 6:
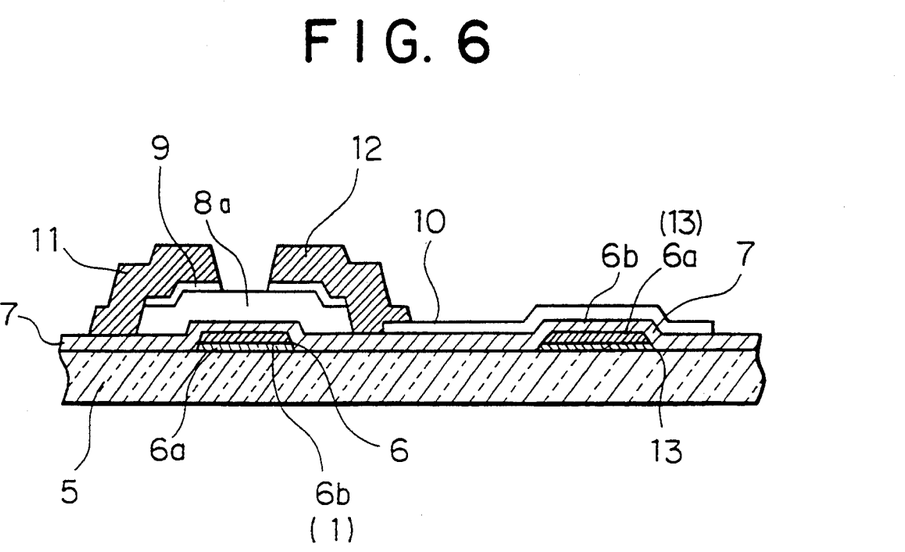
FIG. 6 is a sectional diagram showing the main portion of a substrate for the active matrix liquid crystal display to which the laminated line material of the invention is applied.

FIG. 6 is a sectional view showing the main portion of an active matrix substrate to be used in the active matrix liquid crystal display element shown in FIG. 5. A lower TaN film 6a (containing 40 at. % of N) and an upper Ta film 6b are laminated on the surface of a glass substrate 5 thereby to arrange the gate electrode 6 that is formed integrally with the address line 1. On this laminated film are an $SiO_2$ film 7 and a gate insulating film deposited, and a non-doped a-Si film 8 and an $n^+$-type a-Si film 9 are further deposited on the $SiO_2$ film 7 thereby to form an island-like pattern in the TFT region. After forming a transparent electrode layer 10 for display, a source electrode 11 and a drain electrode 12, both made of a Mo/Al film, are arranged. The drain electrode 12 is formed integrally with the data line 2 shown in FIG. 5. A storage capacitor 13 is made of a $TaN_x$/Ta laminated line material as is the case with the address line 1.

An active matrix substrate having a display area of 19.2 cm × 25.6 cm and a pixel pitch of 400 μm was prepared with the above construction. Specific values and construction of the respective parts of the substrate are as follows. The gate electrode 6 was made up of the lower $TaN_x$ layer 6a of 300 Å in thickness and the upper Ta film 6b of 2200 Å in thickness. The address line 1, formed integrally with the gate electrode 6, was 30 μm wide. This electrode line was tapered by a plasma etching process using $CF_4$ and $O_2$. The resistance of the thus formed address line 1 was 12.3 kΩ. Incidentally, an address line of 2500 Å in thickness prepared by using another line material had a resistance of 160.4 kΩ with Ti, 22.6 kΩ with Mo, 88 kΩ with Ta, and 15.3 kΩ with a Mo—Ta alloy containing 60% of Ta.

The substrate with the address line 1 already formed was subjected to an organic film removing process using an $H_2SO_4 + H_2O_2$ solution, cleaned, and then had the gate insulating layer ($SiO_2$ film) 7 deposited by 3500 Å in thickness through a chemical vapor deposition (CVD) method; and had the a-Si film 8 and the $n^+$-type a-Si film 9 deposited thereon by 3000 Å and 500 Å, respectively. Thereafter, as described above, the a-Si film 9 was patterned, the pixel electrode was formed, and then the data line serving both as the drain electrode 12, and the source electrode 11 were formed.

The liquid display element constructed by using the thus formed active matrix substrate exhibited few shorts between the data line 1 and the address line 2. In contradistinction thereto, the liquid crystal display element having a Ti film as its address line frequently exhibited shorts. The reason is that the foreign matters including organic substances present on the address line 1 cannot be removed due to the line material's not being resistant to a process using strong acids such as $H_2SO_4 + H_2O_2$. If the address line 1 is made of Ti or Cr, on the other hand, the active matrix substrate cannot be taper-etched, thereby reducing the thickness of the $SiO_2$ film 7 at the step of the address lines. Thus, shorts were frequently observed between the address line 1 and the data line 2.

The use of the $TaN_x$/Ta laminated film (line material) as described above allowed the formation of a low resistance high performance address line adapted for display.

With respect to the construction shown in FIG. 6, when the substrate was constructed by laminating a 2200 Å thick N-doped Ta layer (containing 2 at. % of N) on a 300 Å thick $TaN_x$ layer (containing 40 at. % of N) to form the address line 1, the gate electrode 6 and the storage capacitor line 13 thereon and by forming an oxide layer (insulating layer) on these lines thereafter, it exhibited better insulation. More specifically, the surfaces of the address line 1, the gate electrode 6 and the storage capacitor line 13 were anodized in a solution having 0.01 wt. % of citric acid; an about 2000 Å thick oxide film was formed on the surface of the upper N-doped Ta layer (containing 2 at. % of N); thereafter a TFT array was arranged by the above process. On the surfaces of the address line 1, the gate electrode 6 and the storage capacitor line 13 was an anodized film free from pin holes formed. Even if pin holes had been present on the $SiO_x$ film 7 due to contaminants, the oxide film on the $TaN_x$/Ta laminated film 6 insulated the pin holes, thereby eliminating not only shorts between the data line 2 and the address line 1 but also shorts between the pixel and the storage capacitor line 13, producing a better quality display.

Figure 7:
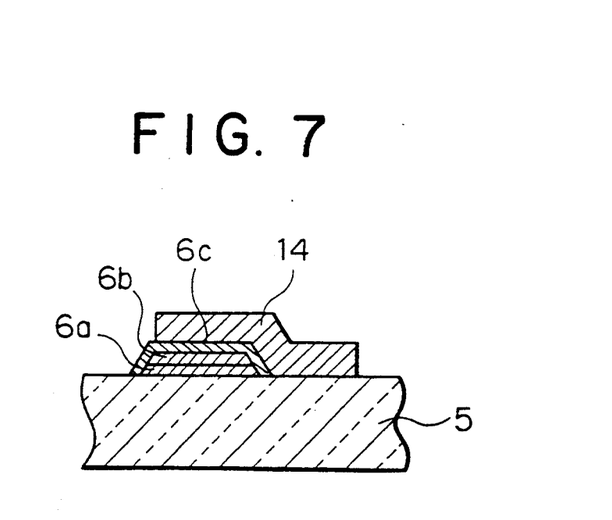
FIG. 7 is a sectional diagram showing the main portion of an MIM element to which the laminated line material of the invention is applied.

FIG. 7 shows an exemplary construction in which the line material of the invention is applied to an MIM element. A 300 Å thick TaN film 6a (containing 40 at. % of N) as the first metal layer and a 2200 Å thick Ta film 6b (containing 2 at. % of N) were sequentially deposited on the surface of a glass substrate 5 and patterned to form a lower electrode line. While covering a contact portion of the lower electrode line with a photoresist, the surface of a laminated line film 6 was selectively formed into an anodized film 6c. The anodization process was effected using the 0.01% citric acid with a constant current oxidation up to 25 V and a subsequent one-hour constant voltage oxidation over 25 V. Thereafter, a laminated film 14 consisting of a 1000 Å thick Cr film and a 1 μm thick Al film was deposited on the anodized film and patterned to form an upper electrode line. The MIM element whose address line resistance was reduced by the use of the TaN/Ta laminated film 6 and which was thus thermally resistant was prepared.

In the above line material the thickness of the lower $TaN_x$ film may be in the order of 300 Å or less, and a thickness of 50 Å or more obtainable under an optimum sputtering condition may produce the upper Ta film of α type. In addition, the formation of an Al layer may precede that of the $TaN_x$ and Ta films. The thus formed line material is advantageously applied not only to lines and electrodes of the TFT and MIM but also to those of other electronic parts and devices. The other alloy Ta—M—N (M=Mo, W, Nb) can be used for laminated line materials. In these cases the M and N content of the upper 2nd layers is preferable to be less than these of M and N content of 1st layer from the view point of resistivity. The other alloy Ta—M—N (M=Mo, W, Nb) can be used for laminated line materials. The semiconductor of a TFT is not limited to the a-Si but may also be a p-Si, and the gate insulating layer may be other insulating layers such as $SiN_x$ or of a laminated structure consisting of two or more layers. Thus, the TFT structure is not limited to a back channel cut type but may be any structure as long as the gate comes on the lower side. For example, the structure that an etching stopper made of an insulating layer is arranged on the channel may also be applicable.

Further, the solution to be used in the anodization is not limited to the citric acid solution but may also be other treatment solutions. The methods of forming the oxide film may include a thermal oxidation method. The TaN/Ta laminated line film provides the same advantage when used together with the data line.

Embodiment 2

Another exemplary line material of the invention and an exemplary embodiment thereof will be described.

As described before, FIG. 4 shows the resistivity of the upper anodized film in function of changing composition of the lower TaN alloy film for the line material of the invention; i.e., the line material having the laminated structure that the anodized film of the TaN alloy layer, which is the second metal layer forming the upper layer, was integrally formed with the TaN alloy film, which is the first metal layer forming the lower layer. As is apparent from the curves shown in FIG. 4, with the fraction of N in the first metal TaN alloy being 45 at. % or less an anodized film whose resistivity is higher than a TaO film can be formed, though depending on the TaN alloy forming condition.

A case in which the laminated line material is applied to an active matrix liquid crystal display element having a circuit equivalent to that shown in FIG. 5 will be now described.

Figure 8:
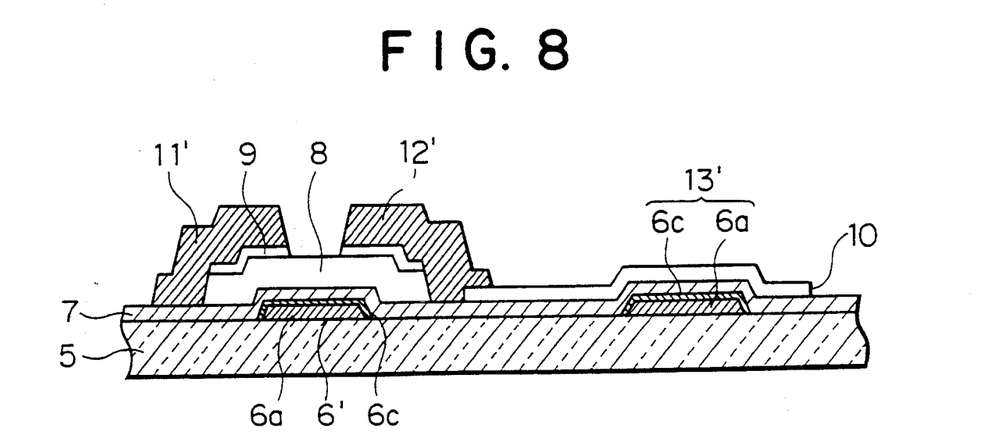
FIGS. 8 to 10 are sectional diagrams each showing the main portion of an active matrix liquid crystal display to which another laminated line material of the invention is applied.

FIG. 8 is a sectional view showing the main portion of an active matrix substrate. A gate electrode 6' integrally formed with an address line 1 on the surface of a glass substrate 5 was arranged by laminating a TaN film 6a and a Ta—N—0 film 6c formed by anodizing the TaN film. On the thus formed gate electrode 6' was an $SiO_2$ film 7 deposited, the film 7 being a gate insulating film. In addition, a non-doped a-Si film 8 and an n+-type a-Si film 9 were deposited on the $SiO_2$ film 7 so that an island-like pattern was formed on the TFT region. After arranging a display ITO electrode 10, a source electrode 11' and a drain electrode 12' made of the Mo/Al film were formed. The drain electrode 12' was integrally formed with the data line 2 in a manner similar to that shown in FIG. 5. A storage capacitor line 13' was formed by laminating the $TaN_x$ film (6a) and the $TaN$—$O_x$ film (6c) as was the case with the address line 1. The alloy is not restricted for TaNx. Oxides of Ta—M—N (M=Mo, Nb, W) alloy are excellent insulating properties like Ta—N—O.

As a result of the above construction, the insulation resistance of the anodized film was sufficiently increased, so that the anodized film could maintain its function as an insulator for any pin holes present on the P-CVD insulating $SiO_x$ film 7. This constitutes a significant contribution to reducing line defects and point defects of the active matrix substrate.

The above construction was satisfactory in a small display, while it was defective with a large display in that an address pulse delay was observed due to high line resistance. This delay is a CR delay caused by the address line resistance and the load capacitance.

Figure 9:
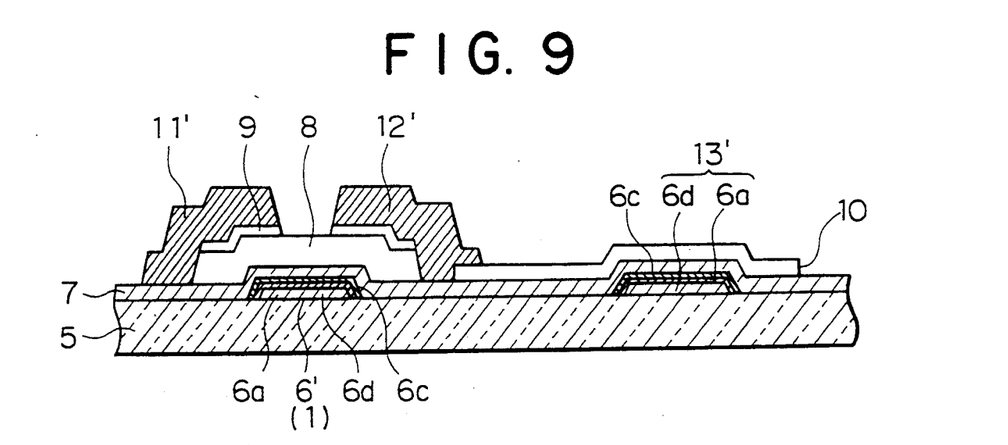

The delay problem was easily overcome in the following manner. As shown in FIG. 9, an address line 6d and a storage capacitor line 6d were formed by sputtering Mo—Ta; thereafter, a TaN film 6a substantially constituting the first and second metals were formed on their surfaces by sputtering; and the surface of the thus formed TaN film 6a was anodized to prepare a Ta—N—O film 6c. Thereafter, an arrayed substrate was similarly formed as before. In this construction, Ta or a laminated film of Ta and Mo—Ta which are similarly anodizable, or low resistance metals such as Al, Cu and Cr or alloys, if a low resistance is required, may be used in place of the Mo—Ta film 6d.

If the leak current tolerance of the active matrix substrate of the above-described construction is not so strict, the TaN film 6a is laminated on the Mo—Ta film, the Ta film or the laminated film 6d of Ta and Mo—Ta by sputtering; thereafter, the address line 1 and the storage capacitor line 13' are formed; and the surface thereof is anodized to form an oxide film 6c. In this case, the oxide film on the lateral sides, being either an Mo—Ta—O film or a Ta—O film, has larger amounts of leak current, but since the bulk of the surface is covered with a Ta—N—O film, the insulation resistance can be made larger compared to that of the conventional construction.

Figure 10:
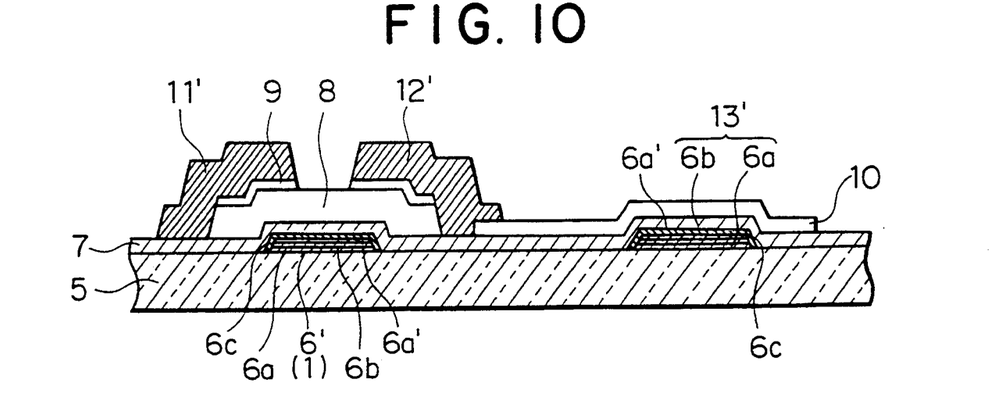

FIG. 10 is a sectional view showing the main portion of another exemplary construction of the active matrix substrate. In this construction, a first metal TaN film 6a, a second metal Ta or slightly N-doped Ta (TAN) film 6b, and a TaN film 6a' were sequentially laminated and sputtered. Thereafter, an address line 1 and a storage capacitor line 13' were formed similarly by patterning and the surface thereof is anodized to form an oxide film 6c. The oxide film 6c on the lateral sides was formed in such a manner that oxides corresponding to the laminated films 6a, 6a', 6b were laminated.

The resistivity of the line material having the Ta or TaN film 6b laminated on the TaN film 6a tends to change in a manner similar to that as shown in FIG. 2. Since the resistance of the upper Ta or TaN film 6b is reduced, it is possible to provide a low resistance material without impairing the thermal resistance of the anodized film as is the case with the Mo—Ta film. In addition, the upper TaN anodized film may be made of a film with insulation optimized by doping a large amount of N. Also in this construction, the upper TaN film 6a' may cover the entire surface of the lower Ta/-TaN film 6a or the TaN/TaN film 6b after they have been patterned. This further reduces leak current.

Figure 11:
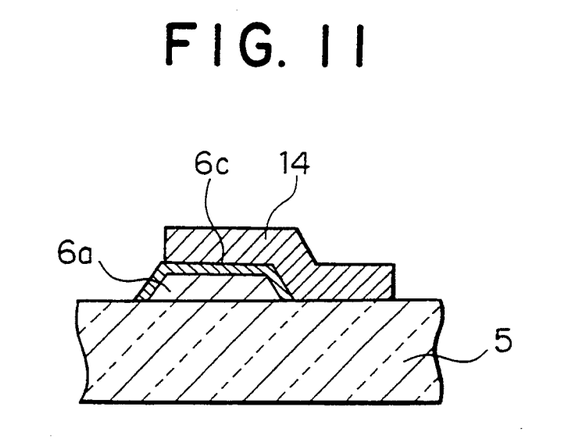
FIGS. 11 and 12 are sectional diagrams each showing the main portion of an MIM element to which the laminated line material of the invention shown in FIGS. 8 to 10 is applied.

FIG. 11 shows a case in which the line material of the invention is applied to an MIM element. A 2200 Å thick TaN film 6a was deposited on the surface of a glass substrate 5 and patterned by CDE to form a lower electrode line. While covering the contact portion of the lower electrode line with a photoresist, an anodized film 6c was formed on the surface of the TaN film 6a. The anodization process was effected using the 0.01% citric acid with a constant current oxidation up to 25 V and a subsequent one-hour constant voltage oxidation over 25 V. Thereafter, a 1 μm thick Al film was deposited on the anodized film and patterned to form an upper electrode line.

Figure 12:
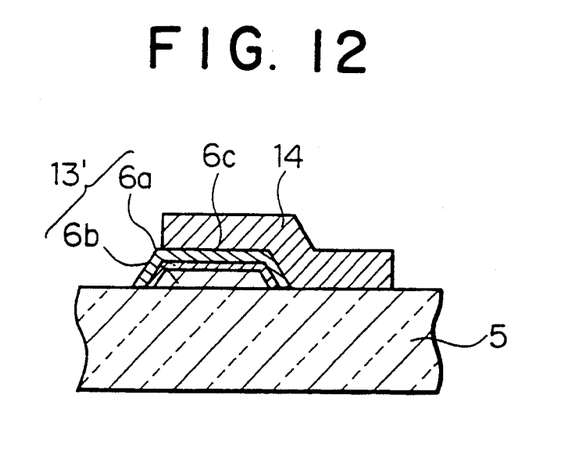

FIG. 12 shows another exemplary construction of the active matrix substrate. As in TFT, a Ta film, an Mo—Ta/Ta laminated film, or a film made of a low resistance metal such as Al, Cu and Cr and alloys was patterned to form a lower electrode; the lower electrode was covered with a TaN film 6a and anodized to form a Ta—N—O film 6c. Further, the advantage similar to that of the TFT may be provided by modifying the construction shown in FIG. 12 to the construction that the TaN film 6a is laminated only on the Ta or Mo—Ta/Ta laminated film 6b of lower electrode and then patterned; and the surface of the TaN film 6a and the lateral sides of the Ta or Mo—Ta/Ta laminated film 6b are anodized or to the construction that the TaN film 6a, the Ta film 6b and the TaN film 6a' are sequentially laminated and then patterned; and the surface of the TaN film 6a' and the lateral sides of the Ta film 6b and the TaN film 6a are anodized.

As is apparent from the above embodiments and FIG. 3, the presence of the element N in the TaN alloy film, which is the second metal layer forming the upper layer, even in small amounts, provides the advantage. It is noted, however, that the content of N up to about 45 at. % exhibits the effect that the Ta—N—O film resulting from anodization has a higher resistivity than the $TaO_x$ film.

The method of forming the TaN film is not limited to sputtering but may be a nitriding process of Ta with plasma or heat. These methods, allowing the entire surface to be covered with the TaN film, are preferable in obtaining the desired advantage. The film thickness forming the lower layer may be 300 Å or less, and a thickness of 50 Å or more provides the upper Ta film of α-type.

The line material of the invention is effective when applied both directly or in modified form not only to TFTs and MIMs but also to other devices. Thus, the semiconductor of the TFT is not limited to the a-Si but may also be the p-Si.

The thermal resistance of the line material of the invention is deteriorated only very slightly (almost negligible) at about 400° C., and this characteristic is similarly observed when the TaN/Ta laminated film is used as a data line. Anodization with solutions other than the citric solution is similarly advantageous.

Further, the gate insulating film of the TFT is not limited to the $SiO_x$ film but may also be an $SiN_x$ film, other insulating films, or a laminate of two or more kinds of insulated films. Also, the TFT structure is not limited to the back channel cut type of the previously described embodiments but may also be any structure as long as its gate is located on the lower side. The structure that an etching stopper made of an insulating film is arranged on the channel may also be applicable.

Figure 13:
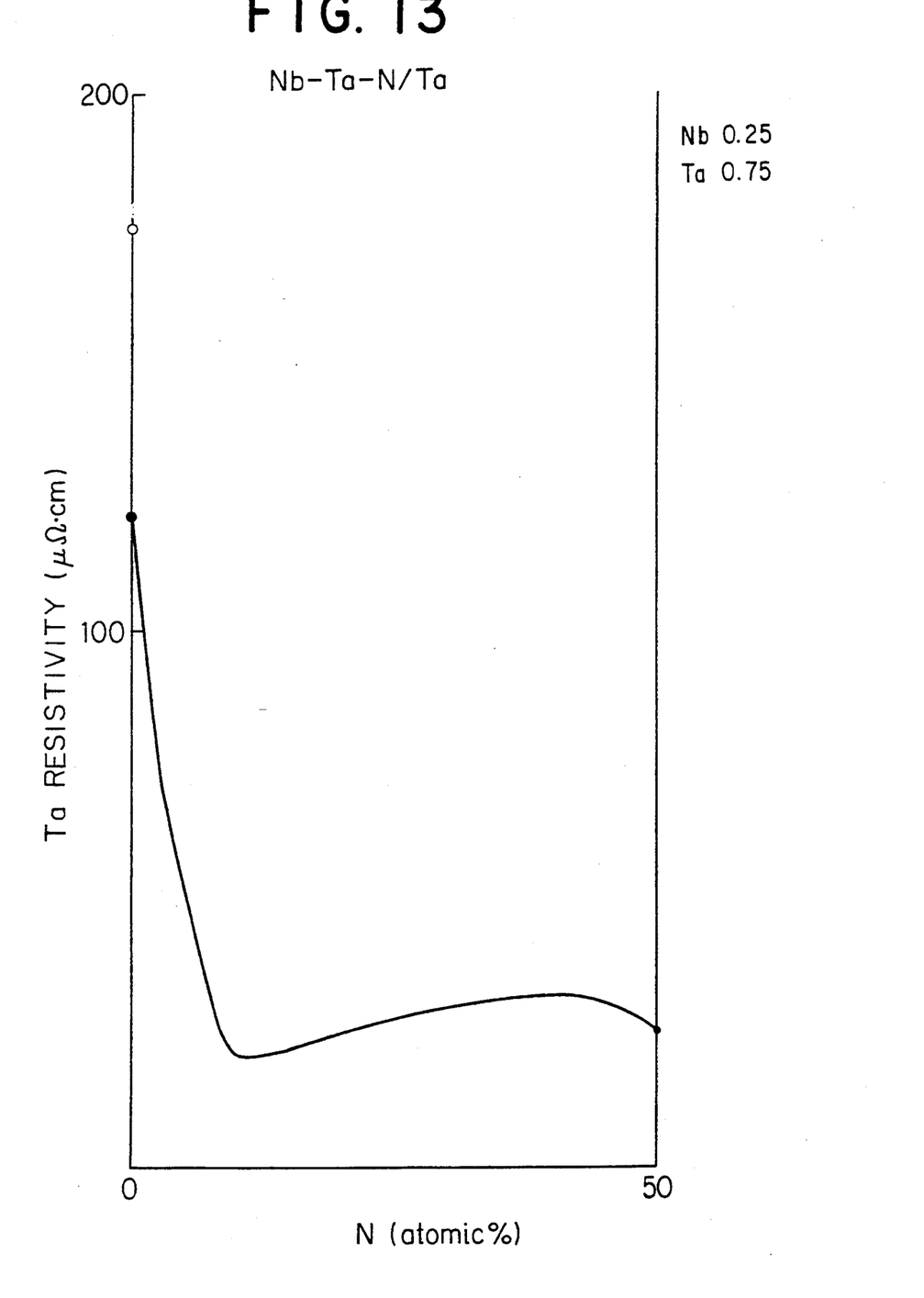
FIGS. 13 and 14 are diagrams each showing the resistivity characteristic of still another laminated line material of the invention.
Figure 14:
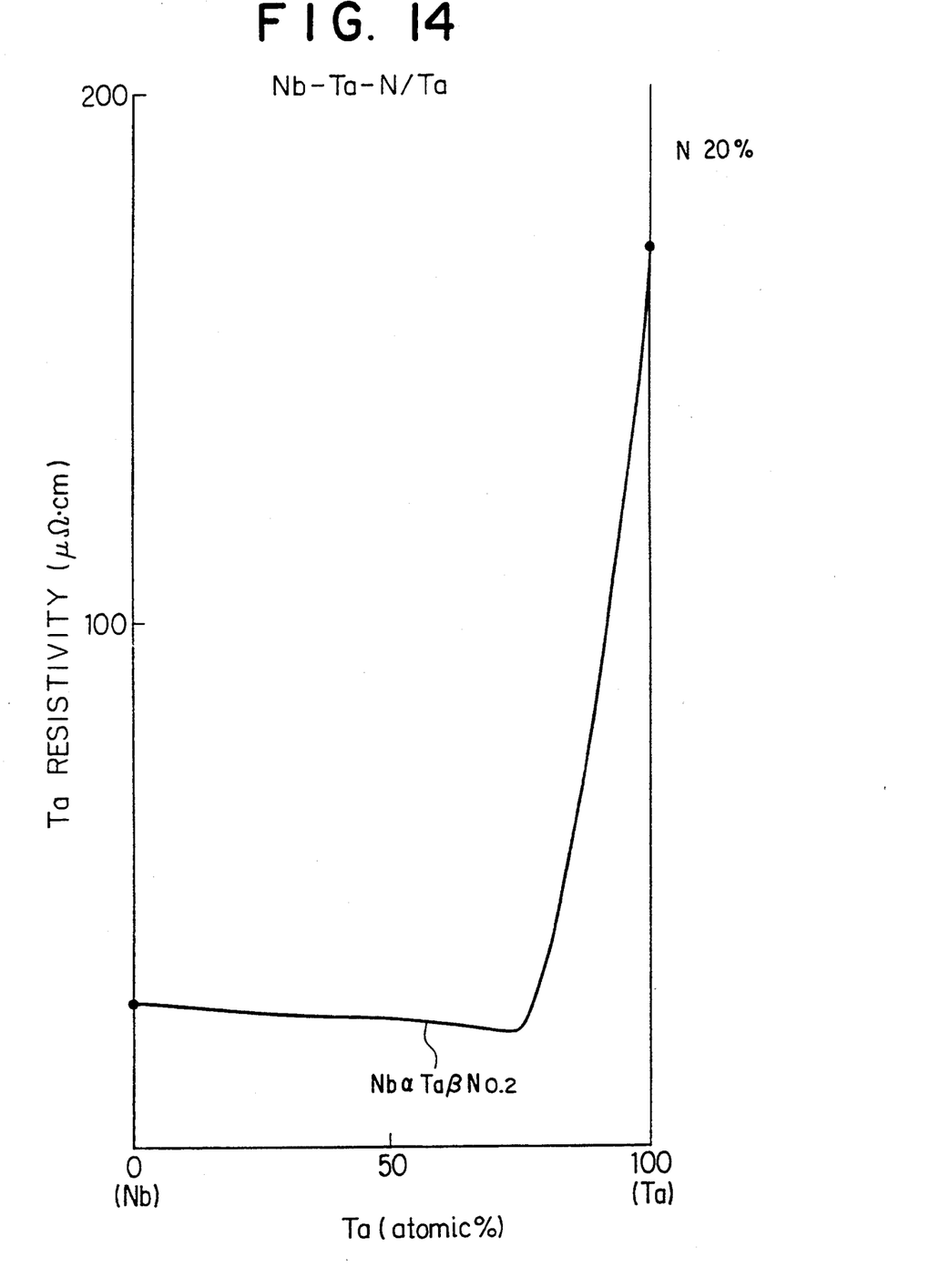

In the above embodiments, the tendency similar to that shown in FIG. 13 and 14 were observed when Ta—Mo—N, Ta—Nb—N or Ta—W—N were used in place of TaN as the first metal, and Ta—Mo and Ta—Mo—N (containing 26 at. % or less of Mo), Ta—Nb and Ta—Nb—N (containing 40 at. % or less of Nb) or Ta—W and Ta—W—N (containing 40 at. % or less of W) were used in place of Ta and TaN as the second metal. For example, the relationship between the composition of the lower Ta—Nb—N film (containing 20 at. % of N) as the first metal layer and the resistivity of the upper Ta film as the second metal layer is as shown in FIG. 14. The alloying of N contributes to reducing the resistivity of Nb upper Ta film over the entire range of its composition. More specifically, the doping of N caused the resistivity of Ta to be reduced from 180 $\mu\Omega$cm to 25 $\mu\Omega$cm, thereby exhibiting the advantage of the invention. The relationship among the composition of the lower Ta—Nb—N film (25 at. % of Nb compared to Ta) as the first metal layer and Ta as the second metal layer and its resistivity is as shown in FIG. 13. From FIGS. 13 and 14, it is possible to expect the advantage of alloying Nb and N over the entire range of their composition in the Ta—Nb—N alloy. The same also applies to the compositions of the Ta—M—N film (M=W, Mo) as the first metal layer forming the lower layer and of the Ta film, the Ta—M—N film (M=W, Mo) or Ta—M film (M=W, Mo) as the second metal layer forming the upper layer.

Figure 15:
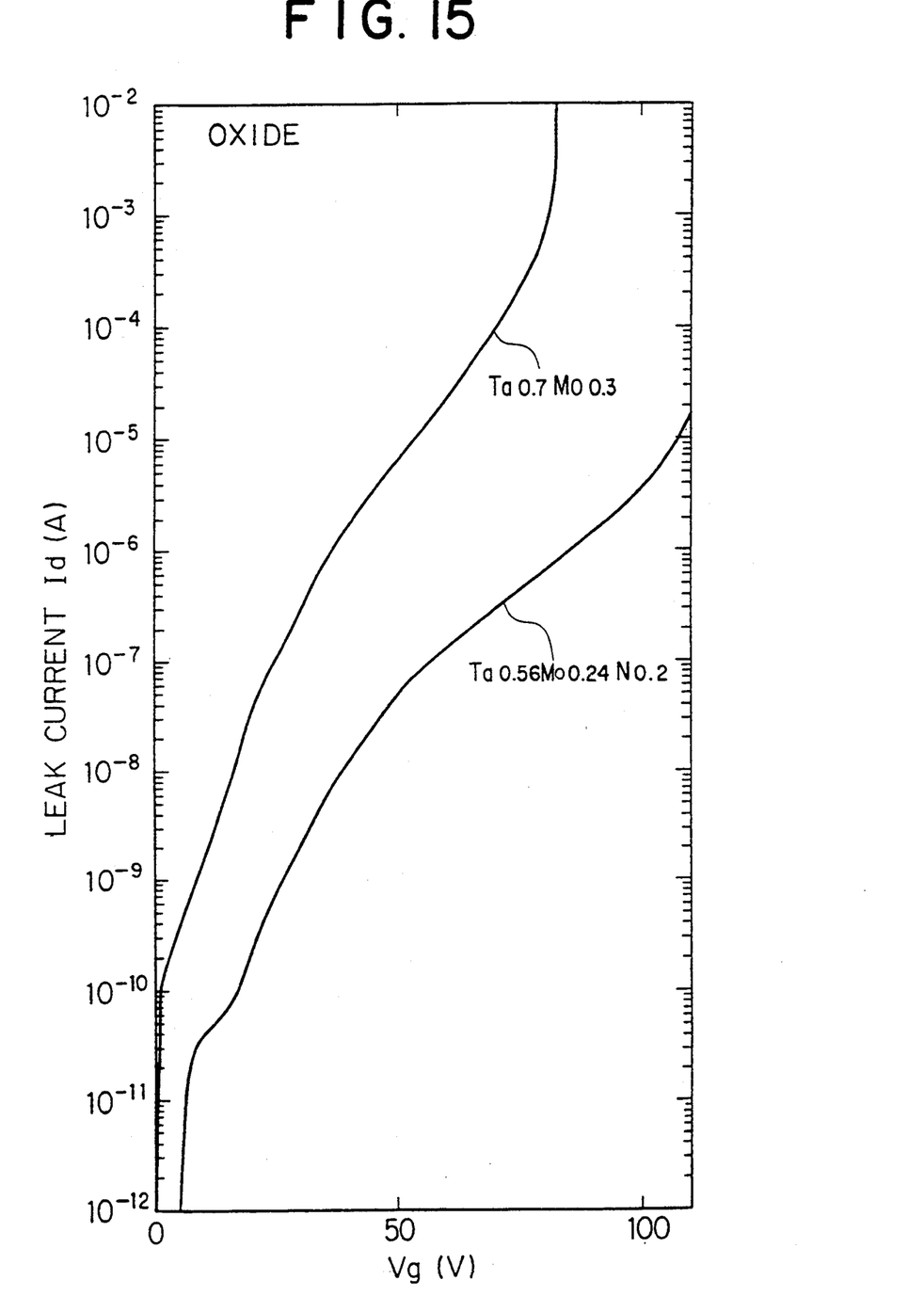
FIGS. 15 to 17 are diagrams each showing the voltage-current (insulation) of an anodized film of the laminated line material of the invention shown in FIGS. 13 and 14, and Ta—W—N.
Figure 16:
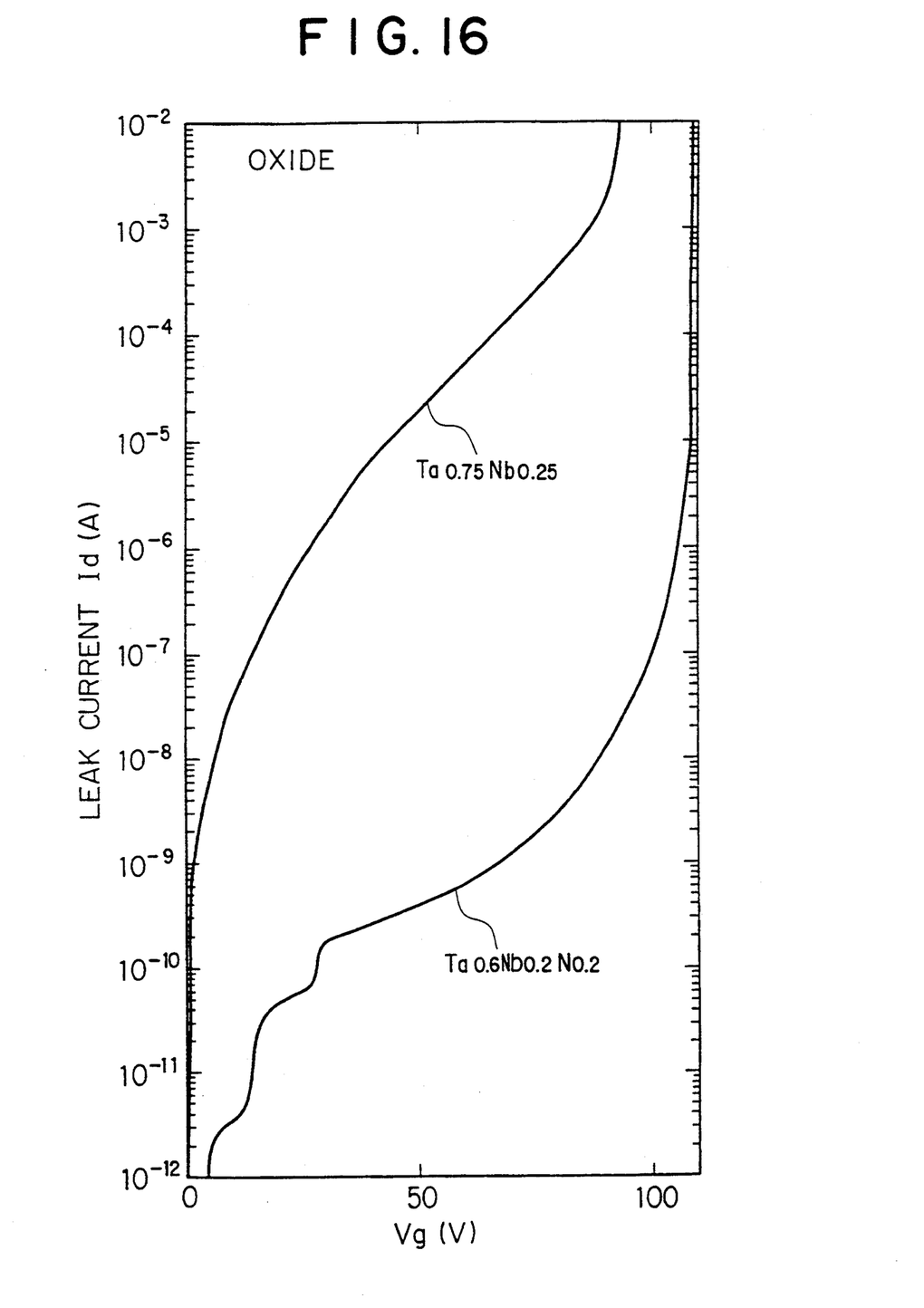
Figure 17:
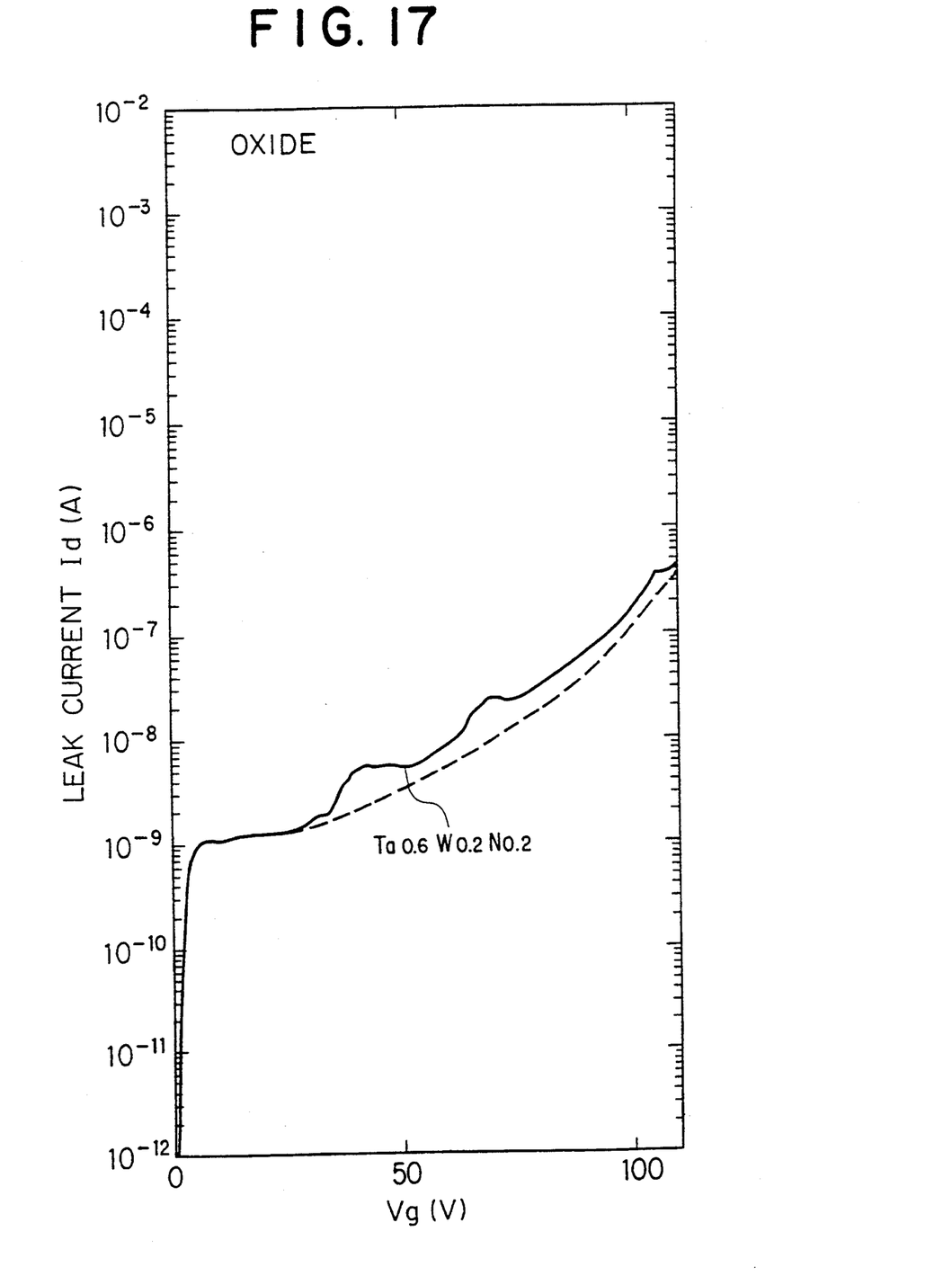

Such low resistance is the same as that exhibited by the TaN/Ta or TaN/TaN compositions, which compositions can be formed into an insulating film by anodization. As shown in FIGS. 15 to 17, insulation of the thus formed insulating films is improved with the doping of N. FIG. 15 shows the leak current of anodic oxide of Ta—Mo—N film in comparison with anodic oxide of Ta—Mo. FIG. 16 shows the leak current of anodic oxide of Ta—Nb—N film. FIG. 17 shows the leak current of the Ta—W—N film. These figures show that insulating characteristic of oxide improve by addition of N.

The reason for the improvement in insulation by the doping of N is presumably that N in the Ta—M—N (M=Nb, Mo, W) forming the lower layer increases the effect of reducing the resistance by converting its crystal structure from a tetragonal to cubic system. That the N increases the resistance of the oxide film made of Ta—M (M=Nb, Mo, W) thereby to improve its thermal resistance is also responsible therefor. Here, M may be any metal capable of forming total solid solution with Ta, and the metals Nb, Mo, and W were so selected as to satisfy such a requirement.

If the line material has a three-layered structure such as Ta—M—N/Ta/Ta—M—N (M is at least one atom selected from the group consisting of Mo, Nb, and W), it exhibits an excellent stability with its $O_2$ diffusion preventing action that serves to confine resistance variations and the like.

Further, in the line material of the invention it is desirable to form the insulating film by anodization but the process of forming the insulating film is not limited thereto.

As described in the foregoing pages, the line material of the invention has a low resistance and the insulating film formed by anodization and the like exhibits excellent insulation and thermal stability. Therefore, when the line material is applied to signal lines of various devices, it exhibits excellent characteristics. If applied to forming the signal lines of a liquid crystal display and electrodes for driving semiconductor elements to be mounted, the line material can provide a low resistance address line. The insulating film prepared by oxidizing the surface exhibits satisfactory insulation and thermal stability, thereby contributing to maintaining sufficient insulating characteristics even after thermal treatments during the fabrication of a liquid crystal display and thus allowing the display to always exhibit highly reliable performance.

What is claimed is:

1. A liquid crystal display, comprising a drive line substrate, a display electrode board disposed so as to confront said drive line substrate, a liquid crystal layer water-tightly sealed between said drive line substrate and said display electrode board, and a drive line and an electrode of an electronic element arranged and mounted on said drive line substrate, said drive line and said electrode being made of a laminated line material,
   wherein said laminated line material comprises a first metal layer made of a low resistance material, a second metal layer deposited integrally on said first metal layer, said second metal layer consisting essentially of a TaN alloy, and a third layer of TaNO formed integrally on said second metal layer.

2. The liquid crystal display of claim 1, wherein said third layer is an anodic oxidized layer.

3. The liquid crystal display of claim 1, wherein said second layer is formed by nitriding a Ta surface.

4. The liquid crystal display of claim 1, wherein said second layer is formed by nitriding a Ta surface with plasma or thermally.

5. A liquid crystal display, comprising a drive line substrate, a display electrode board disposed so as to confront said drive line substrate, a liquid crystal layer water-tightly sealed between said drive line substrate and said display electrode board, and a drive line and an electrode of an electronic element arranged and mounted on said drive line substrate, said drive line and said electrode being made of a laminated line material, wherein said laminated line material comprises a first metal layer made of a low resistance material, a second metal layer deposited integrally on said first metal layer, said second metal layer consisting essentially of a TaN alloy being formed by nitriding a Ta surface with plasma or thermally, and a third layer of TaNO formed integrally on said second metal layer, and said Ta is an α-type Ta.

6. A liquid crystal display, comprising a drive line substrate, a display electrode board disposed so as to confront said drive line substrate, a liquid crystal layer water-tightly sealed between said drive line substrate and said display electrode board, and a drive line and an electrode of an electronic element arranged and mounted on said drive line substrate, said drive line and said electrode being made of a laminated line material, wherein said laminated line material comprises a first metal layer made of at least one metal selected from the group consisting of Al, Cu, Cr and alloys thereof, a second metal layer deposited integrally on said first metal layer, said second metal layer consisting essentially of a TaN alloy, and a third layer of TaNO formed integrally on said second metal layer.

7. The liquid crystal display of claim 1, wherein the atomic % of N of said second metal layer is less than 45 atomic %.

* * * * *